(12) United States Patent
Kobori

(10) Patent No.: US 7,531,856 B2
(45) Date of Patent: May 12, 2009

(54) DISPLAY APPARATUS

(75) Inventor: Isamu Kobori, Tokyo (JP)

(73) Assignee: Sony Corporation, Tokyo (JP)

( * ) Notice: Subject to any disclaimer, the term of this patent is extended or adjusted under 35 U.S.C. 154(b) by 87 days.

(21) Appl. No.: 11/634,692

(22) Filed: Dec. 5, 2006

(65) Prior Publication Data

US 2007/0145350 A1 Jun. 28, 2007

(30) Foreign Application Priority Data

Dec. 6, 2005 (JP) .............................. 2005-351488

(51) Int. Cl.
  *H01L 31/062* (2006.01)
  *H01L 31/113* (2006.01)
(52) U.S. Cl. ........................... 257/290; 257/88; 257/89
(58) Field of Classification Search ................... 257/88, 257/89, 288, 290
See application file for complete search history.

(56) References Cited

U.S. PATENT DOCUMENTS

2006/0102913 A1* 5/2006 Park .............................. 257/89
2006/0163597 A1* 7/2006 Noda et al. .................... 257/98
2008/0042146 A1* 2/2008 Cok et al. ...................... 257/79

FOREIGN PATENT DOCUMENTS

JP 05-258860 10/1993

\* cited by examiner

*Primary Examiner*—Phuc T Dang
(74) *Attorney, Agent, or Firm*—Robert J. Depke; Rockey, Depke & Lyons, LLC

(57) ABSTRACT

A display apparatus that includes: a plurality of light-emitting devices disposed on a substrate with an accumulation of, in this or inverse order, a light transmissive electrode layer, a functional layer including a light-emitting layer, and an opposing electrode layer; and a color conversion layer that is provided on a side of the light transmissive electrode layer for any of the light-emitting devices, and applies color conversion to an emitted light generated by the light-emitting layer for the light-emitting device. In the display apparatus, the light-emitting devices each have a reflective surface on a position where the light-emitting layer is sandwiched with the light transmissive electrode layer, and an optical distance between the reflective surface and the light-emitting layer varies by the light-emitting devices depending on provision of the color conversion layer.

3 Claims, 10 Drawing Sheets

DISPLAY APPARATUS

CROSS REFERENCES TO RELATED APPLICATIONS

The present invention contains subject matter related to Japanese Patent Application JP 2005-351488 filed in the Japanese Patent Office on Dec. 6, 2005, the entire contents of which being incorporated herein by reference.

BACKGROUND OF THE INVENTION

1. Field of the Invention

The present invention relates to a display apparatus that performs color display using thin-film light-emitting devices.

2. Description of the Related Art

An organic electroluminescent device using electroluminescence of an organic material is configured by a light-emitting unit. The light-emitting unit is an accumulation of organic layers, e.g., positive hole transfer layer and light-emitting layer, between an anode and a cathode. Such an organic electroluminescent device has been receiving attention as a light-emitting device, which is capable of high-intensity light emission by low-voltage direct drive.

An exemplary full-color display apparatus using such an organic electroluminescent device has the configuration of including a color conversion layer for use with the organic electroluminescent device. The color conversion layer eliminates the need to form organic layers (light-emitting layers included) for each different color in the course of manufacturing the organic electroluminescent devices, i.e., the need for highly-precise coloring using a metal mask, so that the resulting display apparatus can perform full-color display.

In the display apparatus using such a color conversion layer, an organic electroluminescent device for color conversion is a blue light-emitting device, and subpixels of every color light are each provided with a blue light-emitting device. For subpixels of red and green lights, a color conversion layer is each provided on the light extraction side of the blue light-emitting devices. The color conversion layer serves to absorb the emitted blue lights, and use fluorescence or phosphor or combination thereof to make the absorbed blue lights glow in red or green. On the other hand, subpixels of blue lights are not provided with the color conversion layer, and the blue lights emitted from the blue light-emitting devices are to be extracted as they are. For more details, refer to Patent Document 1 (Patent Application Hei 5-258860).

In the organic electroluminescent devices (blue light-emitting devices) for use with a display apparatus using such a color conversion layer, either an anode or a cathode sandwiching therebetween a light-emitting layer is configured as a reflective electrode layer, and the remaining is configured as a light transmissive electrode layer. From the side of the light transmissive electrode layer, emitted lights are extracted. With such a configuration, the optical distance is optimized between the light-emitting layer and the reflective electrode layer to derive interference for emitted lights generated by the light-emitting layer of the blue light-emitting device, i.e., for interference and intensification between blue lights directly directing to the side of the light emissive electrode layer, and blue lights directing to the side of the light transmissive electrode layer after being reflected on the reflective electrode layer.

The issue with the display apparatus using such a color conversion layer is that, although the emitted blue lights are converted to the color of green with relatively high efficiency, the efficiency is not enough for conversion to the color of red. In consideration thereof, for the aim of increasing the efficiency for conversion to the color of red, proposed is the configuration of adding, to the blue light-emitting devices, a yellow light-emitting component having an absorption wavelength closer to that of the red conversion layer. Such component addition is claimed to increase the conversion efficiency for the red conversion layer, and the extraction intensity of the emitted red lights. For more details, refer to Non-Patent Document 1 ("Flat Panel Display 2004 (practice section)", January 2003, P. 258), and Non-Patent Document 2 ("Flat Panel Display 2004 (strategy section)" January 2003, p. 194).

SUMMARY OF THE INVENTION

The problem here is that, through addition of a yellow light-emitting component to the blue light-emitting devices, the spectrum of the emitted lights from an organic electroluminescent device will be of two colors, i.e., blue and yellow. As a result, the light emission energy will be scattered to two types of light emission, thereby reducing the light emission efficiency for the organic electroluminescent device itself, and reducing the light extraction intensity for subpixels of emitted blue and green lights.

It is thus desirable to provide a full-color display apparatus including a color conversion layer for use with an organic electroluminescent device, capable of increasing the color conversion efficiency for the color conversion layer without reducing the light emission efficiency for the organic electroluminescent device, and increasing, thereby, the extraction intensity for every color light.

According to an embodiment of the present invention, there is provided a display apparatus, including a plurality of light-emitting devices disposed on a substrate. These light-emitting devices are each an accumulation of, in this or inverse order, a light transmissive electrode layer, a functional layer including a light-emitting layer, and an opposing electrode layer. On the side of the light transmissive electrode layer for any of the light-emitting devices, a color conversion layer is provided for color conversion to an emitted light generated by the light-emitting layer for the light-emitting device. The light-emitting devices each have a reflective surface on a position where the light-emitting layer is sandwiched with the light transmissive electrode layer, and an optical distance between the reflective electrode layer and the light-emitting layer varies by the light-emitting devices depending on provision of the color conversion layer.

With the display apparatus configured as such, the optical distance takes various values for the light-emitting devices. Therefore, no matter if the light-emitting devices are provided with a color conversion layer or not, such value variation achieves optimum optical design in such a manner that the light to be extracted will become high in intensity. That is, the optical distance for any light-emitting device not provided with the color conversion layer is set to a value causing interference for the lights emitted from the light-emitting layer of the light-emitting device. Such value setting allows the emitted lights intensified by the interference to be extracted as they are. On the other hand, if the optical distance for any light-emitting device provided with the color conversion layer is set to a value allowing the color lights as a result of conversion by the color conversion layer are extracted by the highest level of intensity, the color lights can be increased in intensity when extracted.

As such, according to the display apparatus of the embodiment of the invention, with the configuration of using the color conversion layer for a part of the light-emitting devices, the color conversion efficiency can be increased for the color conversion layer without reducing the light emission intensity for the light-emitting devices. This thus enables to increase the intensity for extracting the lights varying in color with good efficiency.

DETAILED DESCRIPTION OF THE INVENTION

In the below, the configuration of a display apparatus according to embodiments of the invention is described in detail based on the accompanying drawings.

FIRST EMBODIMENT

Figure 1:
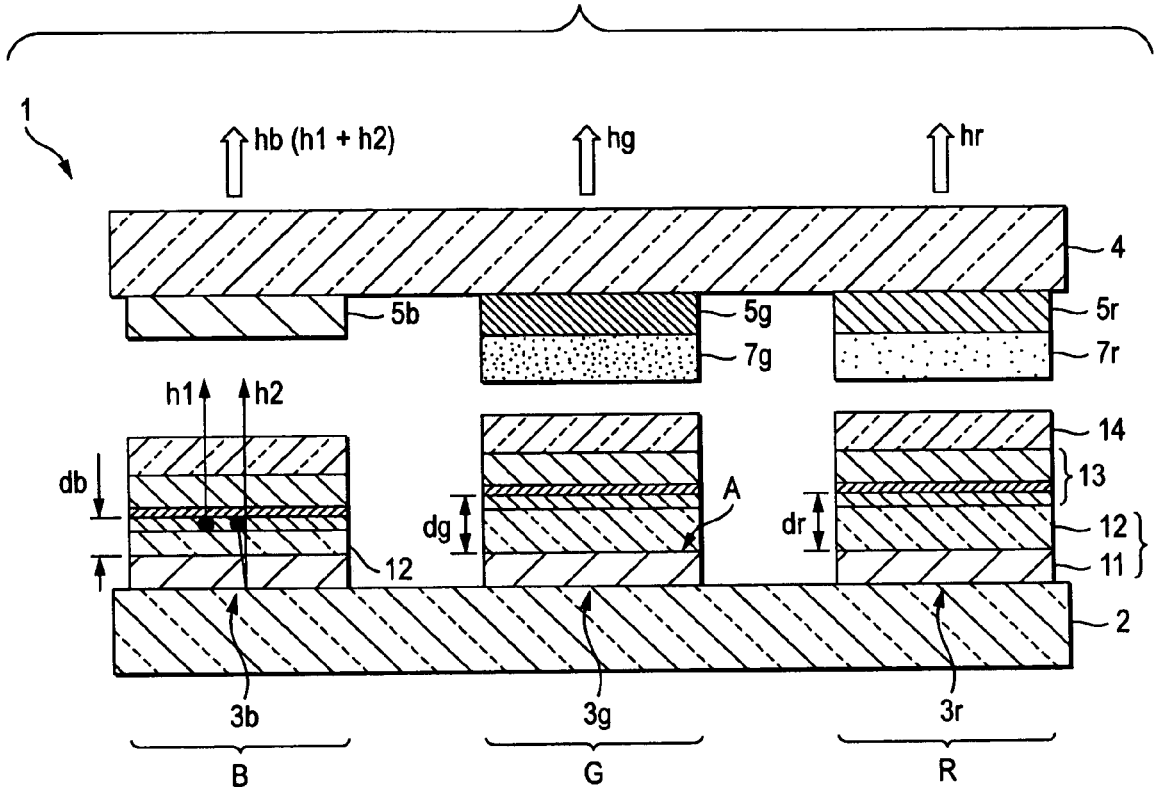
FIG. 1 is a diagram showing the cross sectional configuration of a display device of a first embodiment.
Figure 1:
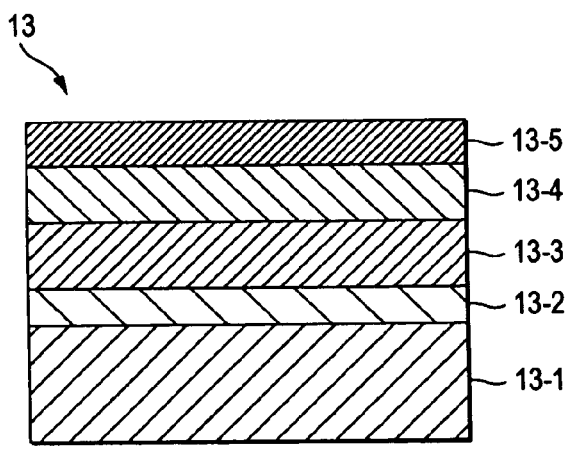

FIG. 1 is a diagram showing the cross sectional configuration of a display apparatus of a first embodiment. A display apparatus 1 of FIG. 1 includes a plurality of light-emitting devices 3b, 3g, and 3r disposed on a substrate 2. Above these light-emitting devices 3b, 3g, and 3r, a sealing substrate 4 is so disposed as to oppose to the substrate 2. The sealing substrate 4 is provided with, on the surface facing the light-emitting devices 3b, 3g, and 3r, color filter layers 5b, 5g, and 5r corresponding to the light-emitting devices 3b, 3g, and 3r, respectively. A part of the color filters, i.e., the color filters 5g and 5r in this example, is provided with color conversion layers 7g and 7r corresponding to the light-emitting devices 3g and 3r, respectively. Between the substrate 2 and the sealing substrate 4, a resin (not shown) is filled so that the resulting display apparatus 1 is structured completely solid with the components sealed together, i.e., the light-emitting elements 3b, 3g, and 3r, the color filter layers 5b, 5g, and 5r, and the color conversion layers 7g and 7r.

The substrate 2 is assumed as being a so-called TFT (Thin Film Transistor) substrate, which includes a TFT for pixel driving, a drive circuit for driving the TFT, or others.

The light-emitting devices 3b, 3g, and 3r are each a thin-film light-emitting device, and in this example, assumed as being an organic electroluminescent device. In this example, a blue subpixel B is provided with the light-emitting device 3b, a green subpixel G with the light-emitting device 3g, and a red subpixel R with the light-emitting device 3r. These light-emitting devices 3b, 3g, and 3r are each formed thereon with, from the side of the substrate 2, a reflective electrode layer 11, a transparent electrode layer 12, a functional layer 13 including a light-emitting layer, and a light transmissive electrode layer 14. In this example, an accumulation of the reflective electrode layer 11 and the transparent electrode layer 12 is used as an opposing electrode layer. The interface between the reflective electrode layer 11 and the transparent electrode layer 12, i.e., the surface of the reflective electrode layer 11 facing the side of the transparent electrode layer 12, serves as a reflective surface A. With such a configuration, the display apparatus 1 including the light-emitting devices 3b, 3g, and 3r is of a so-called top emission structure, i.e., lights emitted by the light-emitting devices 3b, 3g, and 3r are extracted from the side of the light transmissive electrode layer 14 opposite to the substrate 2.

In the structure, the reflective electrode layer 11 and the transparent electrode layer 12 are used as anodes (or cathodes) in the light-emitting devices 3b, 3g, and 3r, and are each patterned as a pixel electrode. The reflective electrode layer 11 is made of a material showing good light reflective characteristics such as silver (Ag). The transparent electrode layer 12 is made of a transparent electrode material such as ITO (Indium Tin Oxide). The transparent electrode layer 12 varies in thickness depending on the optical configuration set to each of the light-emitting devices 3b, 3g, and 3r. This is a major feature of the first embodiment. The optical configuration will be described in detail after the entire configuration of the display apparatus 1 is described.

The functional layer 13 is provided as a common layer for the light-emitting layers 3b, 3g, and 3r, and may be solidly formed on the substrate 2. Note that, for convenient reference, the drawing shows the state that the functional layer 13 is patterned for every pixel.

As shown in the enlarged view of the functional layer 13, the functional layer 13 is an accumulation of, from the side of the anode, e.g., the reflective electrode layer 11 and the transparent electrode layer 12, a positive hole injection layer 13-1, a positive hole transfer layer 13-2, a light-emitting layer 13-3, an electron transfer layer 13-4, an electron injection layer 13-5, and others. This is surely not restrictive, and the functional layer 13 may serve well as long as at least including the light-emitting layer 13-3, and other layers are to be provided as required so as to enable light emission on the light-emitting layer 13-3 with high intensity. In this example, the functional layer 13 is assumed as being configured to emit blue lights for the aim of enabling light emission on the light-emitting layer 13-3 with high intensity.

Note here that the layers 13-1 to 13-5 may be each a single layer or an accumulation of layers, and one layer may be provided with a plurality of functions, e.g., the light-emitting layer 13-3 may serve also as an electron transfer layer.

When the layers, i.e., the reflective electrode layer 11 and the transparent electrode layer 12, are each used as an anode, the light transmissive electrode layer 14 is used as a cathode, and is used as an anode when the layers are each used as a cathode. Such a light transmissive electrode layer 14 is provided as a common layer for the light-emitting devices 3b, 3g, and 3r, and may be solidly formed on the substrate 2. Note that, for convenient reference, the drawing shows the state that the light transmissive electrode layer 14 is patterned for every subpixel.

As such, the light-emitting devices 3b, 3g, and 3r share the same configuration except that their transparent electrode layers 12 are each individually set for the thickness, and the emitted blue lights of the same wavelength are generated by the light-emitting layers 13-3. From the light-emitting devices 3b, 3g, and 3r, a light h1 and a light h2 are extracted out of the lights generated by the light-emitting layers 13-3. The light h1 is directed directly to the side of the transparent electrode layers 14 from the light-emitting layers 13-3, and the light h2 is directed to the side of the transparent electrode layers 14 after being reflected by the reflective electrode layers 11.

On the other hand, the opposing substrate 4 is made of a light transmissive material that extracts emitted lights from the light-emitting devices 3b, 3g, and 3r.

The color filters 5b, 5g, and 5r are so configured as to pass through only color lights of blue, green, and red, respectively. The blue subpixel B is provided with the blue filter 5b, the green subpixel G with the green filter 5g, and the red subpixel R with the red filter 5r.

The color conversion layers 7g and 7r are provided only to the green subpixel G and the red subpixel R, respectively. The green subpixel G is provided with the green conversion layer 7g, which absorbs emitted blue lights generated by the light-emitting device 3g. The green conversion layer 7g includes a fluorescence medium that makes the absorbed blue lights glow in green by fluorescence. The red subpixel R is provided with the red conversion layer 7r, which absorbs emitted blue lights generated by the light-emitting device 3r. The red conversion layer 7r includes a fluorescence medium that makes the absorbed blue lights glow in red by fluorescence.

The material of the above-described layers is not restrictive as long as the material is possibly used in a display apparatus using general organic electroluminescent devices. For the color conversion layers 7g and 7r, for example, the possible options include an organic-fluorescent-dye-dissolved layer, an organic-fluorescent-pigment-dispersed layer, an inorganic-fluorescent-crystal-dispersed layer, and a quantum-dot-fluorescence-dispersed layer.

Described next is the optical configuration of the light-emitting devices 3b, 3g, and 3r being the features in the display apparatus 1 configured as above in the first embodiment.

As described above, these light-emitting devices 3b, 3g, and 3r share the same configuration except that their transparent electrode layers 12 are each individually set for the thickness. The light-emitting layers 13-3 generate emitted blue lights of the same wavelength. From the light-emitting devices 3b, 3g, and 3r, the light h1 and the light h2 are extracted out of the lights generated by the light-emitting layers 13-3. The light h1 is directed directly to the side of the transparent electrode layers 14 from the light-emitting layers 13-3, and the light h2 is directed to the side of the transparent electrode layers 14 after being reflected by the reflective electrode layers 11.

In such a configuration, for the light-emitting device 3b disposed to the blue subpixel B, the optical distance db between the light-emitting layer 13-3 and the reflective electrode layer 11 is set to an optimum value with which interference and intensification occurs at maximum between the lights h1 and h2. Such an optical distance db is calculated based on the wavelength of the emitted blue lights generated by the light-emitting layer 13-3, and the refraction index of every layer disposed between the light-emitting layer 13-3 and the reflective electrode layer 11. Alternatively, primary experiment will also do.

On the other hand, for the light-emitting devices 3g and 3r provided with the color conversion layers 7g and 7r, respectively, the optical distance dg and dr between the light-emitting layers 13-2 and the reflective electrode layers 11 are respectively set to values with which lights hg and hr show the highest level of intensity. Herein, the lights hg and hr are the conversion results, by the color conversion layers 7g and 7r, of the lights h1 and h2 coming from the light-emitting devices 3g and 3r. Such optical distances dg and dr for the green and red subpixels G and R are calculated by primary experiment, for example.

Assuming that the layers have refraction indexes of $n_1$, $n_2$, $n_3$, and others, and the layers have the thickness of $d_1$, $d_2$, $d_3$, and others, the optical distances d (db, dg, and dr) are $d = n_1 \cdot d_1 + n_2 \cdot d_2 + n_3 \cdot d_3 + \ldots$.

In this embodiment, the optical values db, dg, and dr of the light-emitting devices 3b, 3g, and 3r are adjusted by the thickness of their transparent electrode layers 12. To form such transparent electrode layers 12 varying in thickness, repeated process execution will do, i.e., a process of forming an ITO (Indium Tin Oxide) film by sputtering, and a process of applying pattern etching to the ITO film using a mask of resist pattern formed by photolithography. To form the transparent electrode layers 12 varying in thickness, film formation for a plurality number of times using a plurality of masks will also do.

According to the display apparatus 1 configured as such, the light-emitting devices 3b, 3g, and 3r are so configured as to allow the light-emitting layers 13-3 to generate emitted blue light with the high level of intensity. For the light-emitting device 3b disposed to the blue subpixel B, the optical distance db between the light-emitting layer 13-3 and the reflective electrode layer 11 is set to an optimum value with which interference and intensification occurs at maximum between the lights h1 and h2, i.e., the light h1 is directed directly to the side of the transparent electrode layer 14 from the light-emitting layer 13-3, and the light h2 is directed to the side of the transparent electrode layer 14 after being reflected by the reflective electrode layer 11. Accordingly, for the blue subpixel B, the emitted blue lights generated by the light-emitting layer 13-3 are intensified to a further degree by interference. Thus intensified lights are extracted from the side of the opposing substrate 4 after passing through the blue filter 5b. This thus allows, for the blue subpixel B, to extract a blue light hb with the greatest effects.

Unlike such a light-emitting device 3b disposed to the blue subpixel B, for the light-emitting devices 3g and 3r disposed to the green and red subpixels G and R, respectively, the optical distances dg and dr between the light-emitting layers 13-3 and the reflective electrode layers 11 are set to optimum values with which lights hg and hr show the highest level of intensity. The lights hg and hr are the conversion results, by the color conversion layers 7g and 7r, of the lights generated by the light-emitting layers 13-3. Accordingly, for the green and red subpixels G and R, the color lights hg and hr being the conversion results with the aim of deriving the highest level of intensity are extracted from the side of the opposing substrate 4.

According to such a display apparatus 1 of the first embodiment of the invention, the subpixels of blue, green and red (B, G, and R), are provided, respectively, with the light-emitting devices 3b, 3g, and 3r sharing the same functional layer 13. A part of the light-emitting devices, i.e., the light-emitting devices 3g and 3r in this example, are only provided with the color conversion layers 7g and 7r, respectively. Such a configuration does not reduce the intensity of light emission for the light-emitting devices 3b, 3g, and 3r, i.e., the light-emitting devices 3b, 3g, and 3r are so configured as to be able to derive the high level of light intensity, and the color conversion efficiency can be increased for the color conversion layers 7g and 7r. Accordingly, no matter if the light-emitting devices are provided with the color conversion layer or not, i.e., the light-emitting devices 3g and 3r provided with the color conversion layer 7g and 7r, and the light-emitting device 3b provided with no color conversion layer, the color lights hb, hg, and hr can be effectively increased in intensity when extracted.

In the display apparatus of the first embodiment of the invention, the optical distances db, dg, and dr between the light-emitting layers 13-3 and the reflective electrode layers 11 in the light-emitting devices 3b, 3g, and 3r are adjusted by the thickness of their transparent electrode layers 12. This favorably allows every subpixel to share all of the layers configuring the functional layer 13. There is thus no more need for highly-precise coloring using a metal mask in the process of forming the functional layer 13. This is thus considered suitable for high-definition display apparatuses with the higher number of pixels.

Moreover, in the first embodiment described above, through application of the invention to the top-emission display apparatus 1, the thickness-varying transparent electrode layers 12 are patterned on the substrate 2 carrying thereon the reflective electrode layers 11. Because this process is executed before the light-emitting layer 13-3 is formed, the light-emitting layer 13-3 can be protected from any possible damage, i.e., the transparent electrode layers 12 can be formed not by mask vapor deposition but by lithography or etching.

In the above first embodiment, described is the configuration in which the optical distances db, dg, and dr in the light-emitting devices 3b, 3g, and 3r are adjusted by the thickness of their transparent electrode layers 12. Such a configuration is surely not restrictive, and the optical distances db, dg, and dr may be adjusted by the thickness of any layer disposed between the reflective electrode layers 11 and the light-emitting layers 13-3 as long as their values fall in a range not reducing the intensity of lights to be generated by the light-emitting layers 13-3 in the light-emitting devices 3b, 3g, and 3r. For example, the optical values may be adjusted by the thickness of the positive hole injection layers 13-1 or the positive hole transfer layers 13-2, or together with the thickness of the transparent electrode layers 12.

The reflective surface A that defines the optical distances db, dg, and dr for the light-emitting devices 3b, 3g, and 3r is not necessarily the surface of the reflective electrode layer 11. Alternatively, the reflective surface A may be an interface with a refraction index difference.

In the above first embodiment, the light-emitting devices 3b, 3g, and 3r each take the top emission structure. This is not restrictive, and the bottom emission structure will also be a possible option and can lead to the same effects. With this being the case, the substrate 2 is made of a light transmissive material, and the order of layer accumulation may be inverted for the light-emitting devices 3b, 3g, and 3r, i.e., the side of substrate 2 will be the light transmissive electrode layer 14.

SECOND EMBODIMENT

Figure 2:
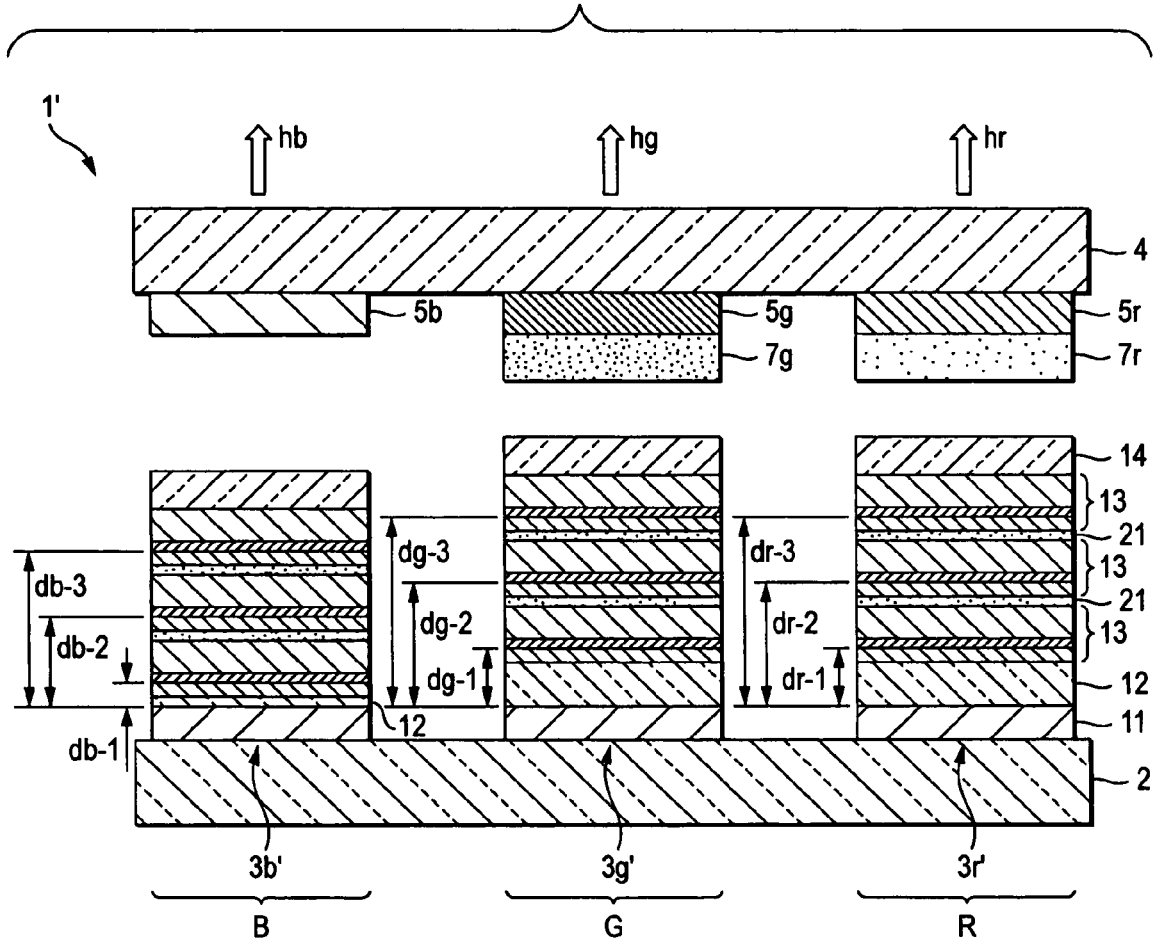
FIG. 2 is a diagram showing the cross sectional configuration of a display device of a second embodiment.

FIG. 2 is a cross sectional diagram showing the configuration of a display apparatus of a second embodiment. A display apparatus 1' of FIG. 2 is different from the display apparatus 1 described by referring to FIG. 1 in the first embodiment in the respect that a plurality of functional layers 13 are accumulated via intermediate electrode layers 21 between the reflective electrode layer 11 and the light transmissive electrode layer 14, and the remaining configuration is similar to each other. The drawing shows an accumulation of the three functional layers 13. This is not the only possibility, and two or more functional layers 13 are good enough, or four or more layers will also do.

The functional layers 13 and the intermediate layers 21 are each provided as a common layer for the subpixels B, G, R, and may be solidly formed on the substrate 2. For convenient reference, the drawing shows the state that the functional layers 13 and the intermediate electrode layers 21 are all patterned.

The accumulation structure of such functional layers 13 is similar to the first embodiment, e.g., the emitted blue lights are to be so generated as to derive the high level of intensity in the light-emitting layer 13-3. The accumulated functional layers 13 may share the same configuration or not.

The intermediate layers 21 are provided for connecting the functional layers 13 in series, and are each made of a high-resistance transparent electrode material such as ITO. The resistance value can be controlled with ease through adjustment of the oxygen concentration when the intermediate electrode layers 21 are formed by sputtering.

In the display apparatus 1' configured as such, light-emitting devices 3b', 3g', and 3r' share the same configuration except that their transparent electrode layers 12 are each individually set for the thickness. The light-emitting layers 13-3 of the respective functional layers 13 generate emitted blue lights of the same wavelength. From the light-emitting devices 3b', 3g', and 3r', the light h1 and the light h2 are extracted out of the lights generated by the three light-emitting layers 13-3. The light h1 is directed directly to the side of the transparent electrode layers 14, and the light h2 is directed to the side of the transparent electrode layers 14 after being reflected by the reflective electrode layers 11.

In such a configuration, for each of the light-emitting devices 3b', 3g', and 3r', the optical distance between their corresponding light-emitting layer 13-3 and reflective electrode layer 11 is set to three values. As an example with the blue subpixel B, the three optical distances include a first optical distance db-1, a second optical distance db-2, and a third optical distance db-3. The first optical distance db-1 is between the first light-emitting layer 13-3 on the side of the substrate 2 and the reflective electrode layer 11. The second optical distance db-2 is between the second light-emitting layer 13-3 on the side of the substrate 2 and the reflective electrode layer 11. The third optical distance db-3 is between the third light-emitting layer 13-3 on the side of the substrate 2 and the reflective electrode layer 11. This is similarly applicable to the green and red subpixels G and R, and three optical distances are set thereto, respectively. Such optical distances db-1 to dr-3 are set similarly to the first embodiment.

That is, for the light-emitting device 3b' disposed to the blue subpixel B, similarly to the first embodiment, the optical distances db-1, db-2, and db-3 between the light-emitting layers 13-3 and the reflective electrode layers 11 are each set to an optimum value with which interference occurs between the lights h1 and h2. Such optical distances db-1, db-2, and db-3 are calculated based on the wavelength of the emitted blue lights generated by the light-emitting layers 13-3, and the refraction index of every layer disposed between the light-emitting layers 13-3 and the reflective electrode layers 11. Alternatively, primary experiment will also do.

On the other hand, similarly to the first embodiment, for the light-emitting devices 3g' and 3r' provided with the color conversion layers 7g and 7r, respectively, the optical distances dg-1, dg-2, dg-3, dr-1, dr-2, and dr-3 between the light-emitting layers 13-3 and the reflective electrode layers 11 are set to optimum values with which lights hg and hr show the highest level of intensity. Herein, the lights hg and hr are the conversion results, by the color conversion layers 7g and 7r, of the lights h1 and h2. Such optical distances dg-1, . . . are calculated by primary experiment, for example.

Similarly to the first embodiment, the optical distances db-1 to dr-3 of the light-emitting devices 3b', 3g', and 3r' are adjusted by the thickness of their transparent electrode layers 12.

Also with the display apparatus 1' configured as such, the optical distances are set individually similarly to the first embodiment, i.e., the optical distances db-1, db-2, and db-3 between the light-emitting layers 13-3 and the reflective electrode layer 11 in the light-emitting device 3b of the blue subpixel B, and the optical distances dg-1, dg-2, dg-3, dr-1, dr-2, and dr-3 between the light-emitting layers 13-3 and the reflective electrode layers 11 in the light-emitting devices 3g' and 3r' disposed to the green and red subpixels G and R disposed to the color conversion layers 7g and 7r, respectively. This enables to increase the color conversion efficiency of the color conversion layers 7g and 7r while achieving the high level of light emission intensity for the light-emitting devices 3b', 3g', and 3r'. Accordingly, the color lights hb, hg, and hr can be effectively increased in intensity when extracted.

In the above-described second embodiment, described is the configuration of adjusting the optical distances db-1 to dr-3 in the light-emitting devices 3b', 3g', and 3r' by the thickness of their transparent electrode layers 12. Such a configuration is surely not restrictive, and the optical distances db-1 to dr-3 may be adjusted by the thickness of any layer disposed between the reflective electrode layers 11 and the light-emitting layers 13-3 as long as their values fall in a range not reducing the intensity of lights to be generated by the light-emitting layers 13-3 in the light-emitting devices 3b', 3g', and 3r'. For example, the optical values may be adjusted by the thickness of the positive hole injection layers 13-1 or the positive hole transfer layers 13-2, or together with the thickness of the transparent electrode layers 12. In the configuration, the positive hole injection layer 13-1 and the positive hole transfer layer 13-2 are each provided to every functional layer 13. By adjusting the thickness of such layers, the optical distances can be optimized in detail to suit their corresponding light-emitting layers 13-3 of the light-emitting devices 3b', 3g', and 3r'. If this is the case, the light-emitting layers 13-3 can serve as a common layer for all of the light-emitting devices 3b', 3g', and 3r'.

The reflective surface A that defines the optical distances db-1 to dr-3 for the light-emitting devices 3b', 3g', and 3r' is not necessarily the surface of the reflective electrode layer 11. Alternatively, the reflective surface A may be an interface with a refraction index difference.

In the second embodiment, the bottom emission structure is also a possible option. If with the bottom emission structure, the substrate 2 is made of a light transmissive material, and the order of layer accumulation may be inverted for the light-emitting devices 3b', 3g', and 3r', i.e., the side of substrate 2 will be the light transmissive electrode layer 14.

In the first and second embodiments described above, described is the case of applying the invention to the display apparatus using light-emitting devices being organic electroluminescent devices. This is not surely restrictive, and the invention is widely applicable to display apparatuses using thin-film light-emitting devices each having a reflective surface opposite to the light transmissive electrode layer for light extraction. This configuration can lead to similar effects.

EXAMPLE 1

In the below, an example 1 and comparison examples 1 and 2 of the invention are described.

EXAMPLE

Figure 3:
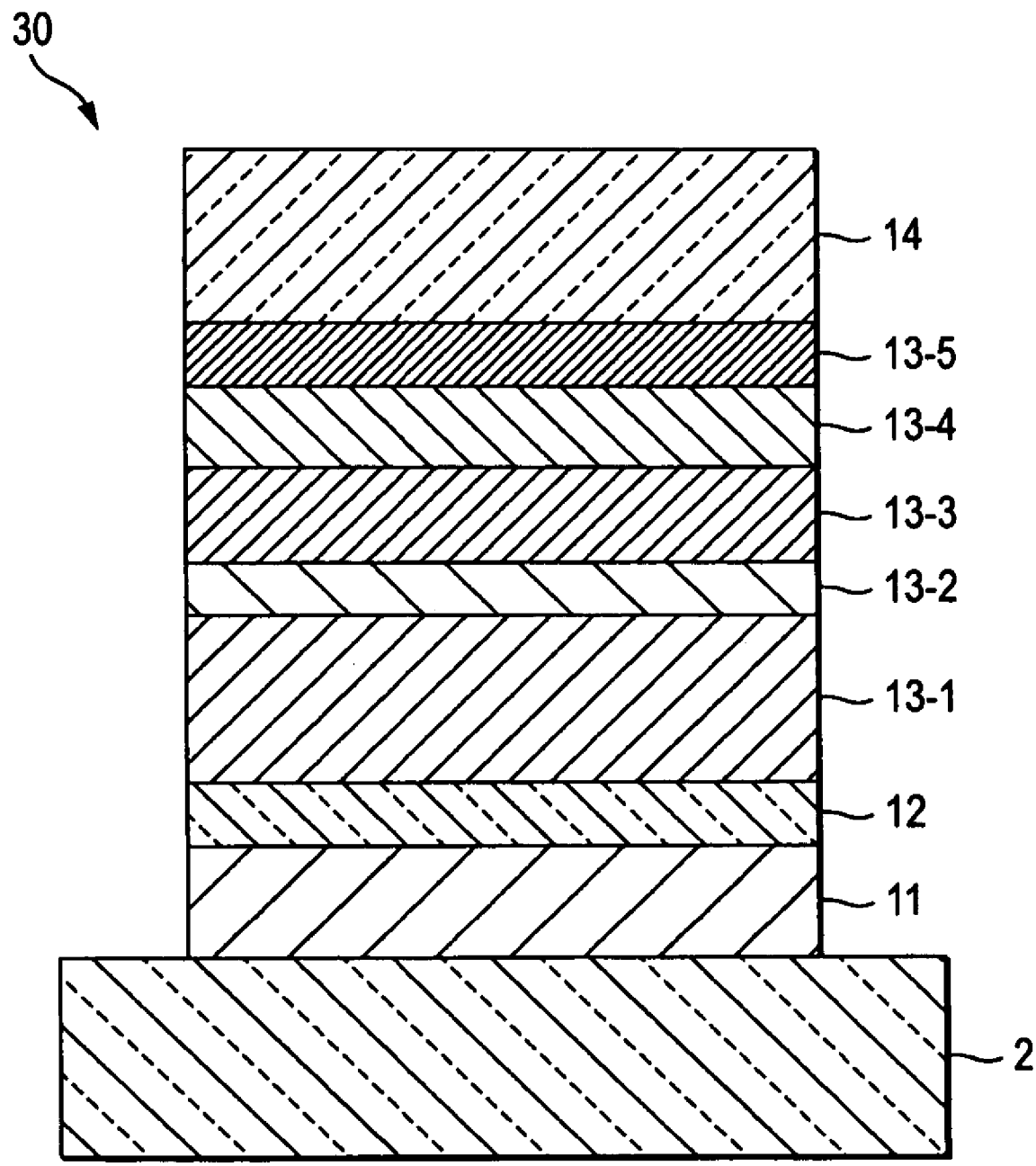
FIG. 3 is a diagram showing the cross sectional configuration of a blue light-emitting device manufactured as a test sample in an example.

First of all, as shown in FIG. 3, a blue light-emitting device 30 is manufactured as a test sample. This light-emitting device 30 is of top emission structure corresponding to the light-emitting devices 3b, 3g, and 3r described by referring to FIG. 1, and manufactured with the following layer structure. Note that the light-emitting device 30 manufactured as a test sample is plurally provided. In the light-emitting device 30, the thickness of the positive hole injection layer 13-1 is so adjusted as to fall in the above range so that the optical distance between the reflective electrode layer 11 and the light-emitting layer 13-3 varies. Herein, the optical distance is denoted as the distance d with no conversion to the optical distance.

Substrate 2: glass
Reflective Electrode Layer 11: Ag (50 nm)
Transparent Electrode Layer 12: ITO (11 nm)
Positive Hole Injection Layer 13-1: m-MTDATA (70 nm to 170 nm)
Positive Hole Transfer Layer 13-2: α-NPD (11 nm)
Light-Emitting Layer 13-3: DPAVBi+5% BCzVBi (30 nm)
Electron Transfer Layer 13-4: Alq3 (10 nm)
Electron Injection Layer 13-5: LiF (0.3 nm)
Light Transmissive Electrode Layer 14: MgAg (1 nm)/ITO (100 nm) accumulation In the course of such a layer accumulation, after layer formation of the reflective electrode 11: Ag (50 nm)/transparent electrode 12: ITO (11 nm), the preprocessing is performed with oxygen plasma. Thereafter, the layers from the positive hole injection layer 13-1: m-MTDATA to the light transmissive electrode 14: MgAg are formed by vacuum deposition using the resistance heating with the pressure of 1E-4 Pa. The ITO (100 nm) is formed by DC magnetron sputtering under the conditions of 0.3 Pa, 1% O2/Ar gas, 5 sccm, and 150 W.

Figure 4:
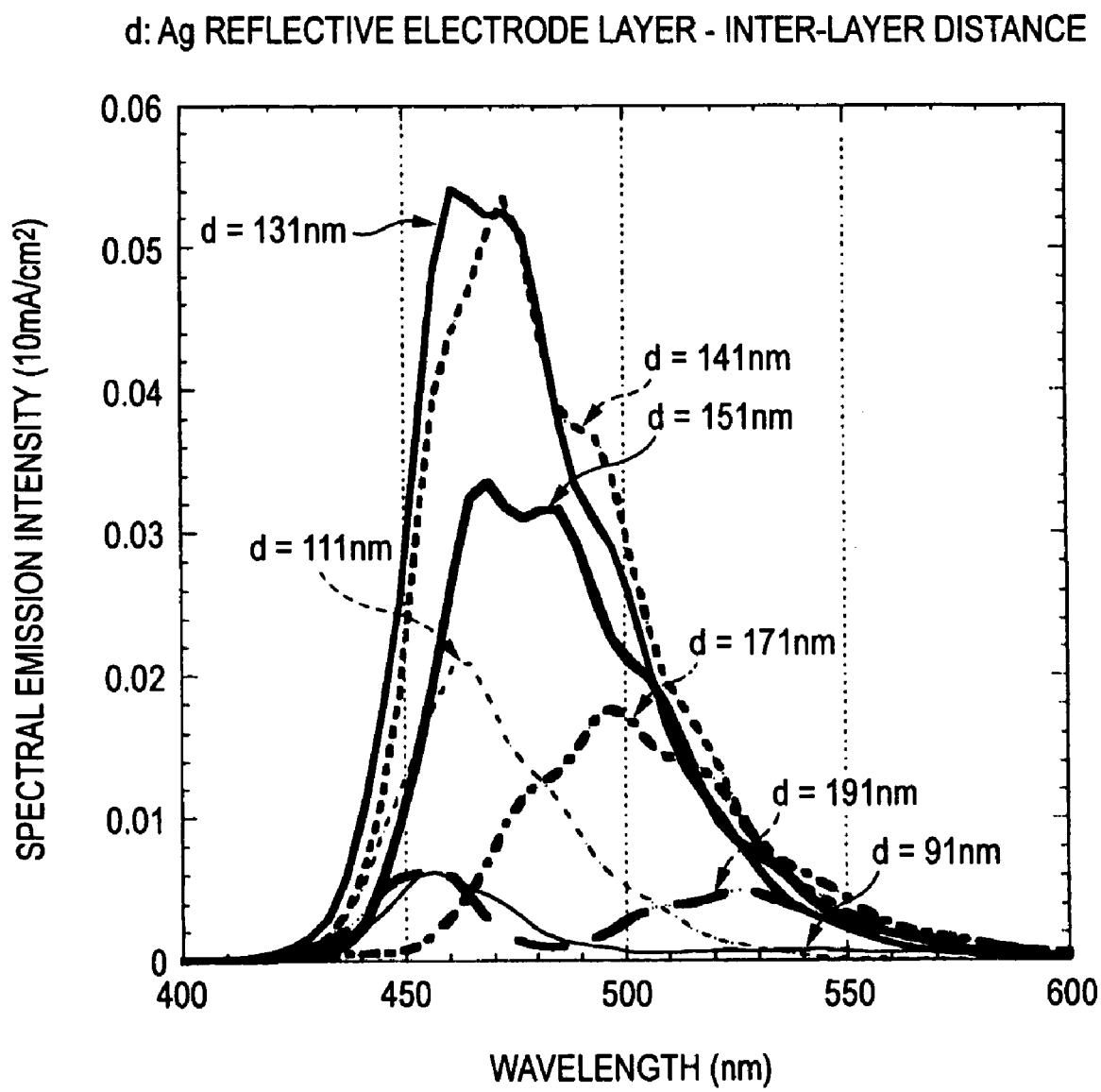
FIG. 4 shows measurement values indicating the spectral emission intensity of the blue light-emitting devices manufactured each as a test sample.

As shown in FIG. 4, the blue light-emitting devices 30 manufactured with factors of distance d are each measured for the spectral emission intensity. The measurement is performed with the current density of 10 mA/cm$^2$. The measurement results tell that the emitted blue lights (wavelength 460 nm) shows the highest level of light emission intensity with the distance d=131 nm. Based on these results, the distance d=131 nm (thickness 110 nm of the positive hole injection layer 13-1: m-MTDATA) is selected for the optical distance db in the light-emitting device 3b of the blue subpixel B. This value holds true for the theory of optical interference.

Figure 5:
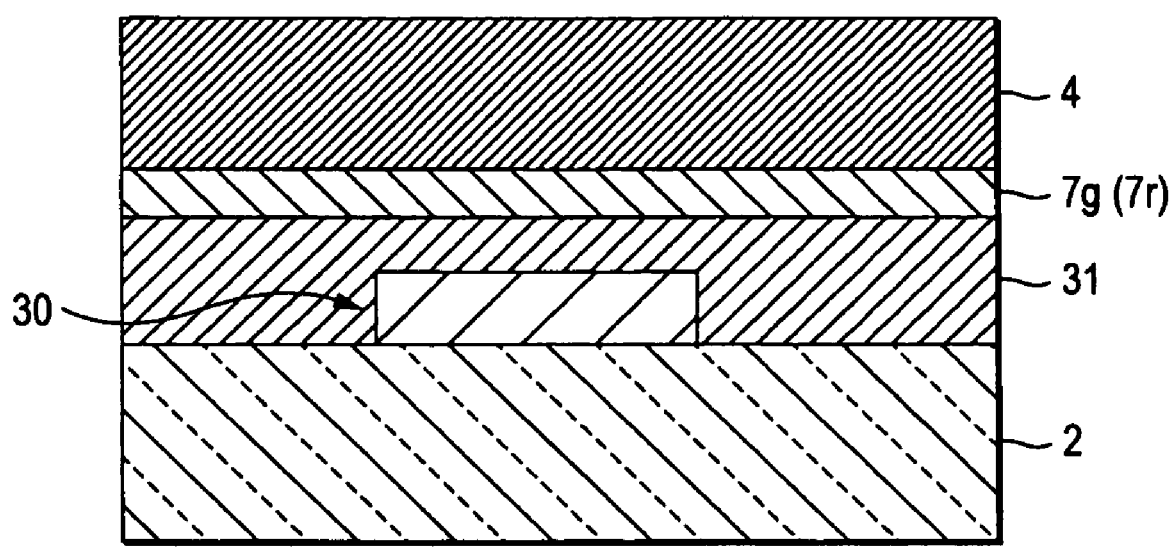
FIG. 5 is a diagram showing the light-emitting device being a test sample provided with a color conversion layer.

As shown in FIG. 5, the light-emitting devices 30 manufactured as test samples are attached with, on the light extraction side, i.e., on the side of light transmissive electrode, the opposing substrate 4 via the color conversion layers 7g and 7r and an adhesive resin 31.

In the green conversion layer 7g, fluorescent particles are dispersed in the resin with the ratio of about 40 wt %. The fluorescent particles are made of $SrGa_2S_4$:Eu, and each have the diameter smaller than 3 μm. The green conversion layer 7g is formed on a cover glass 32 with the thickness of about 30 μm. In the red conversion layer 7r, fluorescent particles are dispersed in the resin with the ratio of about 40 wt % (refraction index of n=1.60 with wavelength of 460 nm. The fluorescent particles are made of SrS:Eu, and each have the diameter smaller than 3 μm. The red conversion layer 7r is formed on the cover glass 32 with the thickness of about 30 μm.

Figure 6:
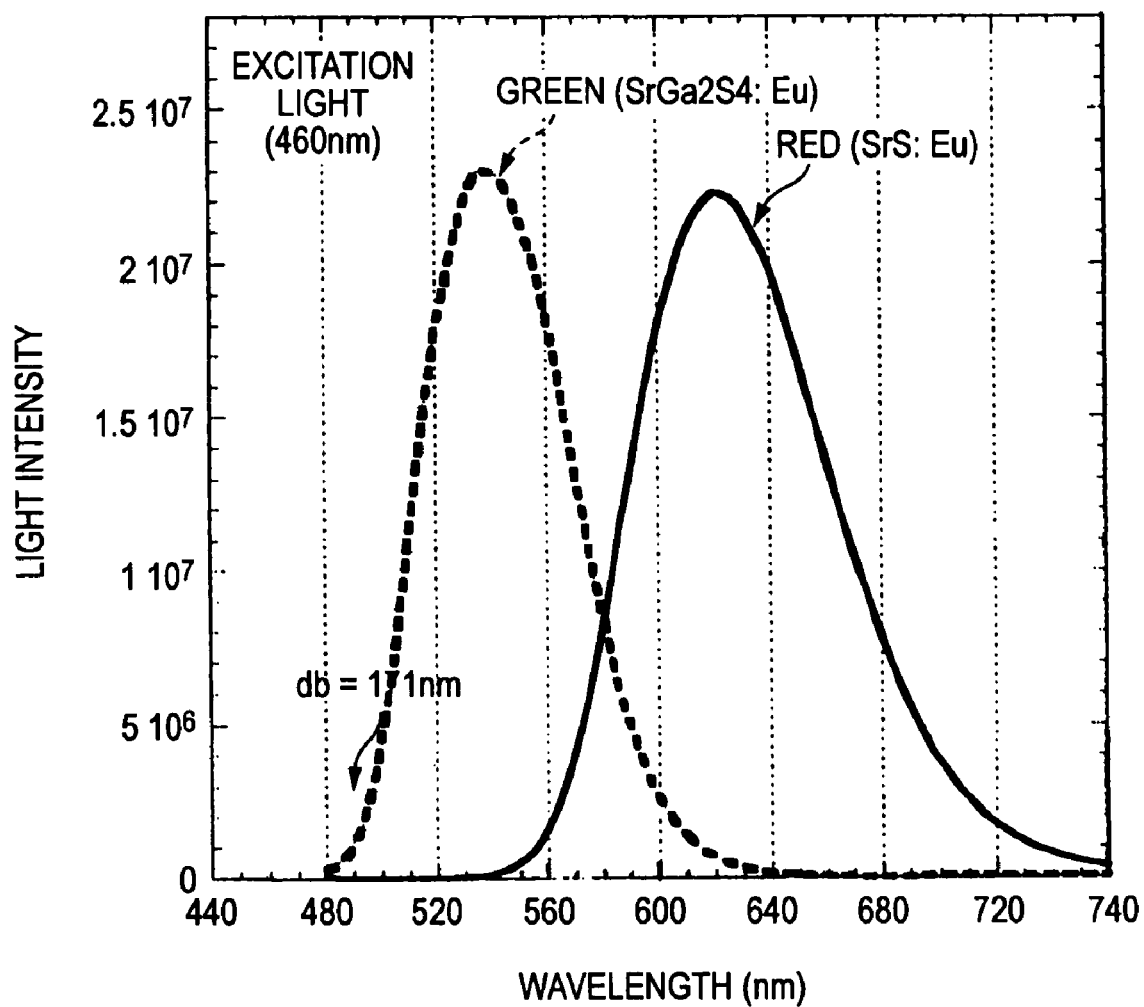
FIG. 6 is a diagram showing the fluorescence spectrum of the color conversion layer.

FIG. 6 shows the fluorescent spectrum of the color conversion layers 7g and 7r. The excitation light is assumed as being a blue light with the wavelength of 460 nm. As shown in the spectrum, the green conversion layer 7g converts the blue light into a light of the green wavelength area, and the red conversion layer 7r converts the blue light into a light of the red wavelength area.

As shown in FIG. 5, the light-emitting device 30 manufactured as a test sample for each of the emitted blue lights is provided with the color conversion layers 7g and 7r on the side for light extraction. With such a light-emitting device 30, lights to be extracted from the color conversion layers 7g and 7r are subjected to a process to measure the light emission intensity.

Figure 7:
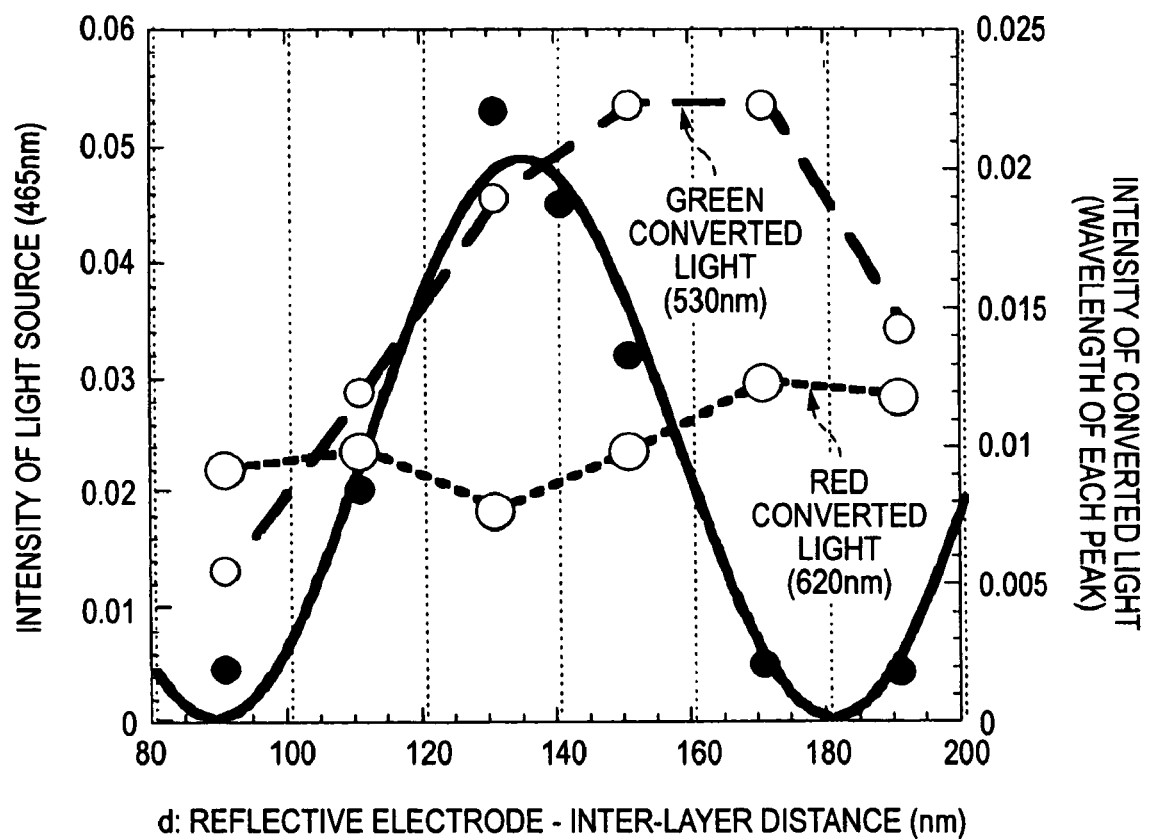
FIG. 7 shows measurement values indicating the color conversion intensity for varying distances between a reflective electrode layer and a light-emitting layer of the light-emitting device being a test sample.

FIG. 7 shows the measurement results indicating the intensity (color conversion intensity) derived for the lights extracted from the color conversion layers 7g and 7r with the distance d between the reflective electrode layer 11 and the light-emitting layers 13-3 of the respective light-emitting devices 30. The measurement is performed with the current density of 10 mA/cm$^2$. Note that FIG. 7 also shows the measurement results derived using the light emission intensity of the light-emitting devices 30 (wavelength 465 nm) as the light source intensity.

The measurement results tell that the lights extracted via the green conversion layer 7g show the highest level of intensity (color conversion intensity) in the vicinity of the distance d=150 nm to 170 nm. The measurement results also tell that the lights extracted via the red conversion layer 7r show the highest level of intensity (color conversion intensity) in the vicinity of the distance d=170 nm. Based on these measurement results, the distance d=171 nm (thickness 150 nm of the positive hole injection layer 13-1: m-MTDATA) is selected for the optical distances dg and dr in the light-emitting devices 3g and 3r provided to the green and red subpixels G and R.

The light source intensity shows a cosine curve with respect to the distance d, and it is thus known that simple optical interference is occurring with the maximum value in the vicinity of d=130 nm. However, in the vicinity of d=171 nm adopted for the light-emitting devices 3g and 3r disposed to the green and red subpixels G and R, it is known that the light source intensity is extremely low, and the emitted lights are hardly extracted without the color conversion layers 7g and 7r.

As such, after the optical distances db, dg, and dr are selected for the light-emitting devices 3b, 3g, and 3r disposed to the subpixels B, G, and R, such a display apparatus 1 as shown in FIG. 1 is manufactured with the light-emitting devices 3b, 3g, and 3r to which such optical distances db, dg, and dr are set. At this time, the layer structure from the transparent electrode layer 14 to the color conversion layers 7g and 7r is similar to the light-emitting element 30 manufactured as a test sample, and the one described by referring to FIG. 5.

Figure 8:
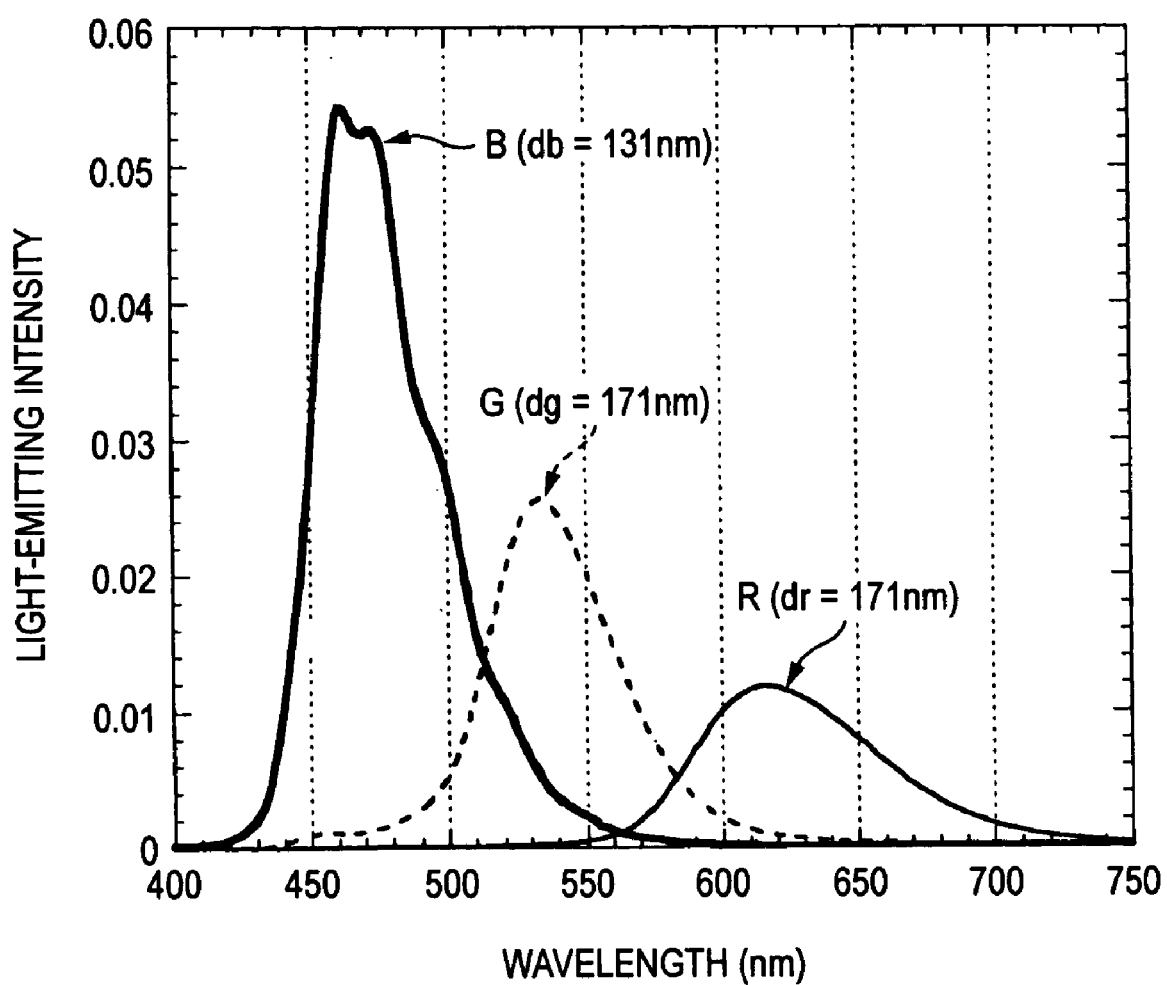
FIG. 8 shows measurement values indicating the intensity (light emission intensity) of lights extracted from subpixels B, G, and R in a display apparatus in the example.

FIG. 8 is shows the measurement values of the intensity (light emission intensity) of lights extracted from the subpixels B, G, and R in the display apparatus 1 configured as such. The measurement is performed with the conditions of the current density of 10 mA/cm$^2$, the drive voltage of about 10V, and the light-emission area of 4 mm$^2$.

COMPARISON EXAMPLE 1

In the display apparatus configured as shown in FIG. 1, manufactured is a display apparatus similar to that of the example 1 except that the distance d1=131 nm for the light-emitting devices 3b, 3g, and 3r.

Figure 9:
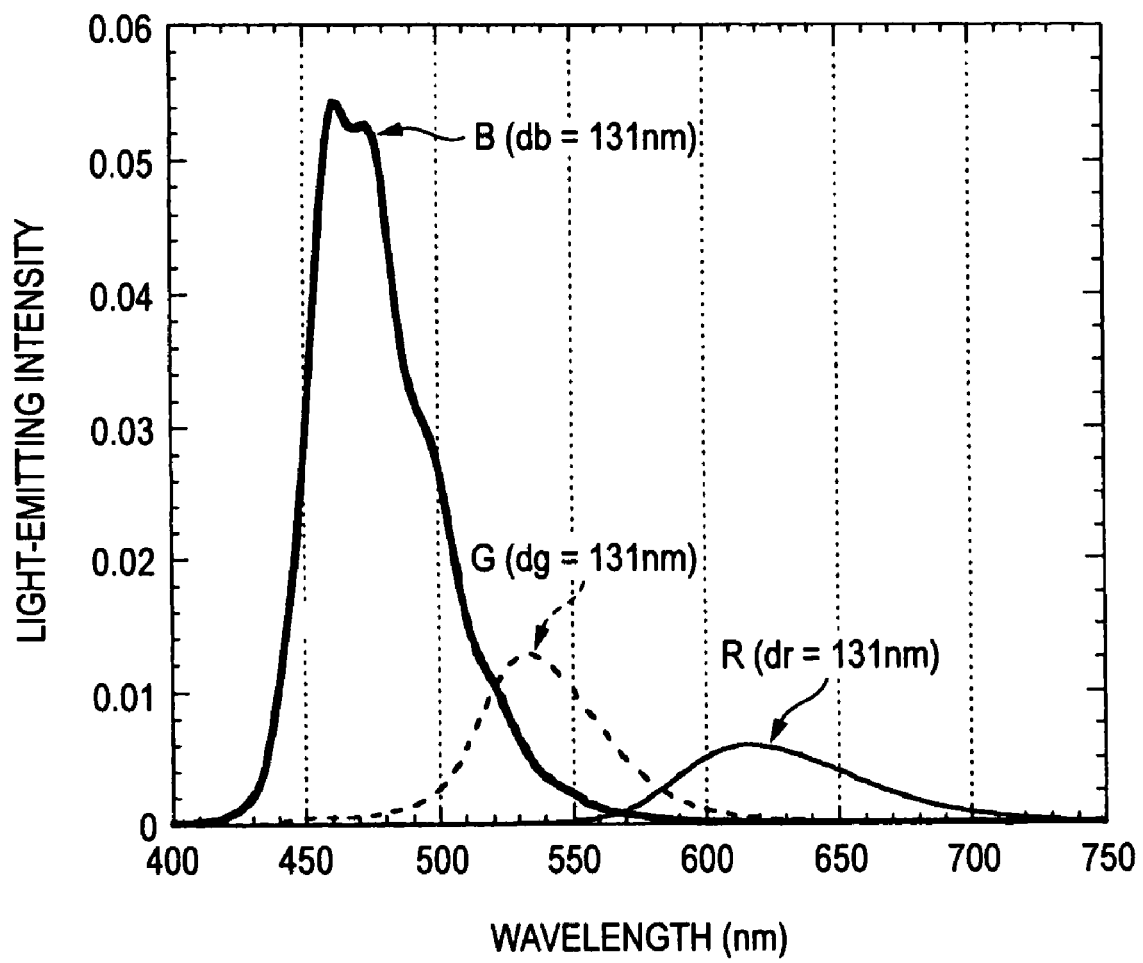
FIG. 9 shows measurement values indicating the intensity (light emission intensity) of lights extracted from subpixels B, G, and R in a display apparatus manufactured in a comparison example 1.

FIG. 9 shows the measurement values of the intensity (light emission intensity) of lights extracted from the subpixels B, G, and R in the display apparatus in the comparison example 1. The measurement is performed similarly to the example.

COMPARISON EXAMPLE 2

In the display device configured as shown in FIG. 1, manufactured is a display apparatus similar to that of the example 1 except that the distance d1=171 nm for the light-emitting devices 3b, 3g, and 3r.

Figure 10:
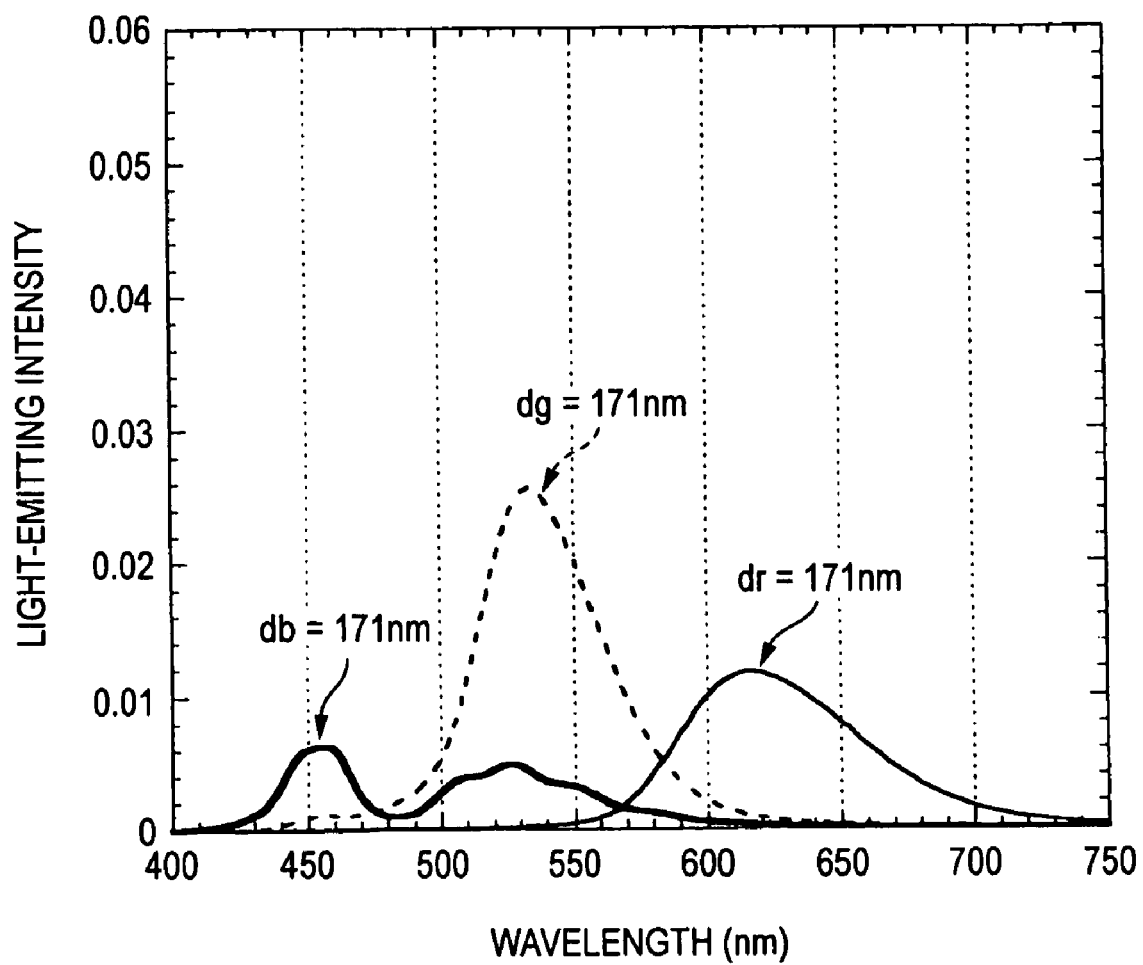
FIG. 10 shows measurement values indicating the intensity (light emission intensity) of lights extracted from subpixels B, G, and R in a display apparatus manufactured in a comparison example 2.

FIG. 10 shows the measurement values of the intensity (light emission intensity) of lights extracted from the subpixels B, G, and R in the display apparatus in the comparison example 1. The measurement is performed similarly to the example.

Evaluation Results

Through comparison of FIGS. 8 to 10, the display apparatus of the example to which the invention is applied is confirmed as deriving the high level of light emission intensity for every subpixel, i.e., subpixels R, G, and B compared with the comparison examples 1 and 2 (FIGS. 9 and 10). This confirms the effects of the invention, changing the optical design between the light-emitting devices 3g and 3r provided with, respectively, the color conversion layers 7g and 7r, and the light-emitting device 3b for direct extraction of emitted lights with no color conversion layer provided.

That is, even under the optical interference conditions that blue lights are less extracted to the outside, the color conversion layer favorably leads to the optimum optical conditions, i.e., the high conversion light intensity for color conversion. This is because, mainly, the light entering the color conversion layers 7g and 7r from the light-emitting devices 3g and 3r is observed with angle dependence, and when the distance d between the light-emitting layer and the reflective electrode layer exceeds some value (130 nm in this example), the light emission is intensified in the diagonal direction. This may be the reason why the lights entering the color conversion layers 7g and 7r is maximized in the vicinity of the distance d=171 nm.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
 a plurality of light-emitting devices disposed over a substrate having, in this or inverse order, a light transmissive electrode layer, a functional region including a light-emitting layer, and an opposing electrode layer; and
 a color conversion layer that is provided at a side of the light transmissive electrode layer for at least some of the light-emitting devices, wherein
 the light-emitting devices each have a reflective surface at a position opposite the light transmissive electrode layer with the functional region therebetween, and
 wherein an optical distance between the reflective surface and the light-emitting layer varies among the light-emitting devices depending on whether the color conversion layer is located at the light emitting device; and further, wherein the optical distance for any of the light-emitting devices that is not provided with the color conversion layer is set to a value with which interference occurs to the emitted light generated by the light-emitting layer of the light-emitting device, and the optical distance for any of the light-emitting devices provided with the color conversion layer is set to a value with which a light of a predetermined wavelength as a result of conversion by the color conversion layer is extracted with the highest level of intensity.

2. A display apparatus comprising:

a plurality of light-emitting devices disposed over a substrate having, in this or inverse order, a light transmissive electrode layer, a functional region including a light-emitting layer, and an opposing electrode layer;and a color conversion layer that is provided at a side of the light transmissive electrode layer for at least some of the light-emitting devices, wherein the light-emitting devices each have a reflective surface at a position opposite the light transmissive electrode layer with the functional region therebetween, and wherein an optical distance between the reflective surface and the light-emitting layer varies among the light-emitting devices depending on whether the color conversion layer is located at the light emitting device; and further, wherein a transparent electrode layer having a thickness for adjusting the optical distance is provided between the reflective surface and the functional region, and the functional region is provided as a common region for use among the light-emitting devices.

3. A display apparatus comprising:

a plurality of light-emitting devices disposed over a substrate having, in this or inverse order, a light transmissive electrode layer, a functional region including a light-emitting layer, and an opposing electrode layer; and a color conversion layer that is provided at a side of the light transmissive electrode layer for at least some of the light-emitting devices, wherein the light-emitting devices each have a reflective surface at a position opposite the light transmissive electrode layer with the functional region therebetween, and wherein an optical distance between the reflective surface and the light-emitting layer varies among the light-emitting devices depending on whether the color conversion layer is located at the light emitting device; and further, wherein an intermediate layer is provided between the opposing electrode layer and the light transmissive electrode layer for electrically connecting the functional layer.

* * * * *